(12) United States Patent
Li

(10) Patent No.: US 10,014,472 B2
(45) Date of Patent: Jul. 3, 2018

(54) THIN FILM TRANSISTOR AND MANUFACTURING METHOD THEREOF, ARRAY SUBSTRATE, DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Hongpeng Li, Beijing (CN)

(73) Assignees: BOE Technology Group Co., Ltd., Beijing (CN); Beijing BOE Optoelectronics Technolody Co., Ltd., Beijing (CN)

( * ) Notice: Subject to any disclaimer, the term of this patent is extended or adjusted under 35 U.S.C. 154(b) by 7 days.

(21) Appl. No.: 15/136,293

(22) Filed: Apr. 22, 2016

(65) Prior Publication Data

US 2016/0380201 A1    Dec. 29, 2016

(30) Foreign Application Priority Data

Jun. 26, 2015    (CN) .......................... 2015 1 0363671

(51) Int. Cl.
*H01L 51/00* (2006.01)
*G03F 7/20* (2006.01)
(Continued)

(52) U.S. Cl.
CPC ............ *H01L 51/0012* (2013.01); *G03F 7/20* (2013.01); *G03F 7/32* (2013.01); *H01L 51/0003* (2013.01);
(Continued)

(58) Field of Classification Search
CPC .................................................. H01L 51/0012
See application file for complete search history.

(56) References Cited

U.S. PATENT DOCUMENTS 7,482,207 B2    1/2009  Brown et al.
8,541,779 B1    9/2013  Chen et al.
(Continued)

FOREIGN PATENT DOCUMENTS

CN       1745487 A    3/2006
CN     101212020 A    7/2008
(Continued)

OTHER PUBLICATIONS

Second Chinese Office Action in Chinese Application No. 201510363671.9, dated Apr. 12, 2017 with English translation.
(Continued)

*Primary Examiner* — Fernando L. Toledo
*Assistant Examiner* — Valerie N Newton
(74) *Attorney, Agent, or Firm* — Collard & Roe, P.C.

(57) ABSTRACT

A thin film transistor and manufacturing method thereof, an array substrate, a display panel and a display device are provided. The method includes a step of forming an organic semiconductor layer on a hydrophilic structural layer. The step includes forming a lipophilic material layer on an upper surface of the hydrophilic structural layer; patterning the lipophilic material layer to remove the lipophilic material located at regions other than a region for forming the organic semiconductor layer thereon and remain the lipophilic material located at the region for forming the organic semiconductor layer thereon to form a lipophilic layer; and forming the organic semiconductor layer on the lipophilic layer through a wet process by using the lipophilic organic material.

13 Claims, 2 Drawing Sheets

(51) Int. Cl.
*G03F 7/32* (2006.01)
*H01L 51/05* (2006.01)
*H01L 27/32* (2006.01)

(52) U.S. Cl.
CPC ...... *H01L 27/3244* (2013.01); *H01L 51/0558* (2013.01)

(56) References Cited

U.S. PATENT DOCUMENTS

| | | | | |
|---|---|---|---|---|
| 2004/0214381 A1* | 10/2004 | Ohta | ................ | H01L 51/001 438/197 |
| 2009/0136877 A1* | 5/2009 | Suganuma | ......... | H01L 51/0016 430/325 |
| 2010/0140600 A1* | 6/2010 | Clough | ................ | B82Y 10/00 257/40 |

FOREIGN PATENT DOCUMENTS

| CN | 101409230 A | 4/2009 |
|---|---|---|
| CN | 101587939 A | 11/2009 |
| CN | 101783393 A | 7/2010 |
| CN | 103035846 A | 4/2013 |

OTHER PUBLICATIONS

Chinese Office Action in Chinese Application No. 201510363671.9, dated Mar. 2, 2017 with English translation.

\* cited by examiner

THIN FILM TRANSISTOR AND MANUFACTURING METHOD THEREOF, ARRAY SUBSTRATE, DISPLAY PANEL AND DISPLAY DEVICE

CROSS REFERENCE TO RELATED APPLICATIONS

Applicant claims priority under 35 U.S.C. § 119 of Chinese Application No. 201510363671.9 filed on Jun. 26, 2015, the disclosure of which is incorporated by reference.

TECHNICAL FIELD

Embodiments of the present disclosure relate to a thin film transistor and manufacturing method thereof, an array substrate, a display panel and a display device.

BACKGROUND

With the development of display manufacturing technology, a liquid crystal display develops rapidly and has become mainstream of future flat panel display instead of conventional cathode ray tube (CRT) display. In the technical field of the liquid crystal display, a thin film transistor liquid crystal display (TFT-LCD) is widely used in televisions and computers and the like due to its advantages of big size, highly integration, powerful function, technological flexibility, and low cost.

Organic thin film transistor refers to a transistor of which the semiconductor layer is made of organic materials. Comparing to a conventional thin film transistor, the organic thin film transistor has a lower production cost and has a wider application. However, it is difficult to form the organic materials of the organic thin film transistor on a film layer (which usually is a hydrophilic structural layer) bearing the organic materials through a wet process of large area.

SUMMARY

An embodiment of the present invention provides a method of manufacturing a thin film transistor. The method includes: a step of forming an organic semiconductor layer on a hydrophilic structural layer. The step of forming the organic semiconductor layer on the hydrophilic structural layer comprises steps of: forming a lipophilic material layer on an upper surface of the hydrophilic structural layer; patterning the lipophilic material layer to remove the lipophilic material located at regions other than a region for forming the organic semiconductor layer thereon and remain the lipophilic material located at the region for forming the organic semiconductor layer thereon to form a lipophilic layer; and forming the organic semiconductor layer on the lipophilic layer through a wet process by using the lipophilic organic material.

In an example, the hydrophilic structural layer includes a gate insulating layer.

In an example, the lipophilic material layer comprises hexamethyldisilazane (HMDS).

In an example, the step of patterning the lipophilic material layer to remove the lipophilic material located at regions other than a region for forming the organic semiconductor layer thereon and remain the lipophilic material located at the region for forming the organic semiconductor layer thereon to form a lipophilic layer includes: applying photoresist on the lipophilic material layer; exposing and developing the photoresist to form a photoresist remained region and a photoresist removed region; removing a part of the photoresist on the photoresist remained region and the lipophilic material on the photoresist removed region; and removing the remained photoresist from the photoresist remained region to form the lipophilic layer.

In an example, after removing a part of the photoresist on the photoresist remained region and the lipophilic material on the photoresist removed region and before removing the remained photoresist from the photoresist remained region to form the lipophilic layer, performing a hydrophilic treatment on an upper surface of the hydrophilic structural layer on the region in which the lipophilic material is removed.

In an example, the step of performing a hydrophilic treatment on the upper surface of the hydrophilic structural layer on the region in which the lipophilic material is removed includes: cleaning the upper surface of the hydrophilic structural layer on the region in which the lipophilic material is removed by using a surface treatment agent; or bombarding the upper surface of the hydrophilic structural layer on the region in which the lipophilic material is removed by using ions.

In an example, the surface treatment agent includes benzoic acid or diazonium salt.

In an example, the lipophilic organic material includes 6,13-bis (triisopropylsilylethynyl) pentacene.

According to an embodiment of the present disclosure, an organic thin film transistor includes: a hydrophilic structural layer; a lipophilic layer formed on the hydrophilic structural layer; and an organic semiconductor layer formed on the lipophilic layer. The organic semiconductor layer has a same area with the lipophilic layer and the position of the organic semiconductor layer corresponds to that of the lipophilic layer.

According to an embodiment of the present disclosure, an array substrate includes: a substrate; and an array of organic thin film transistors formed on the substrate, wherein the array of organic thin film transistors includes the organic thin film transistors.

According to an embodiment of the present disclosure, a display panel includes the array substrate.

According to an embodiment of the present disclosure, a display device includes the display panel.

BRIEF DESCRIPTION OF THE DRAWINGS

Embodiments of the present invention will be described in detail hereinafter in conjunction with accompanying drawings to allow one of ordinary skill in the art to understand the present invention more clearly, in which.

DETAILED DESCRIPTION

Technical solutions according to the embodiments of the present disclosure will be described clearly and completely as below in conjunction with the accompanying drawings of embodiments of the present disclosure. It is apparent that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Embodiments of the disclosure provide a method of manufacturing a thin film transistor. The method includes a step of forming an organic semiconductor layer on a hydrophilic structural layer. The step of forming the organic semiconductor layer on the hydrophilic structural layer includes: forming a lipophilic material layer on an upper surface of the hydrophilic structural layer; patterning the lipophilic material layer to remove the lipophilic material located at regions other than a region for forming the organic semiconductor layer thereon and remain the lipophilic material located at the region for forming the organic semiconductor layer thereon to form a lipophilic layer; and forming the organic semiconductor layer on the lipophilic layer through a wet process by using the lipophilic organic material.

In the method of manufacturing the thin film transistor provided by an embodiment of the present disclosure, the lipophilic material layer is firstly formed on the hydrophilic structural layer and then the lipophilic material layer is patterned to get the lipophilic layer, the organic material is only attached to the lipophilic layer when the lipophilic organic material is deposited by a wet process. As such, it can be readily to realize wet fabrication of the thin film transistor.

According to different types of thin film transistors, the hydrophilic structural layer may refer to different structure layers, such as a substrate, a gate insulating layer or a passivation layer and the like. Furthermore, the above method for manufacturing the thin film transistor further includes steps of manufacturing a gate electrode, a source electrode and a drain electrode. The manufacturing method and the manufacturing procedures of a bottom gate type of the thin film transistor will be described hereinafter in conjunction with accompanying drawings according to embodiments of the disclosure. The method includes the following steps.

Figure 1:
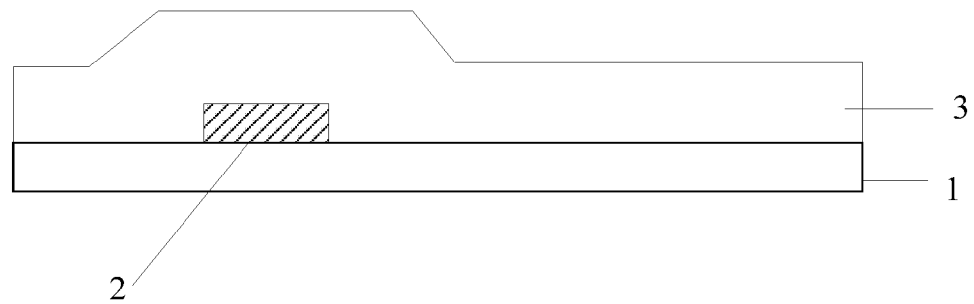
FIGS. 1-7 are a flow chart of a method of manufacturing a thin film transistor according to an embodiment of the present disclosure, which show relevant structures formed in various steps of the method.

Step S1, a gate electrode 2 and a gate insulating layer 3 are formed on a substrate 1. FIG. 1 shows a schematic diagram of the structure formed by step S1, and the structure includes the substrate 1, the gate electrode 2 and the gate insulating layer formed on the substrate 1.

Figure 2:
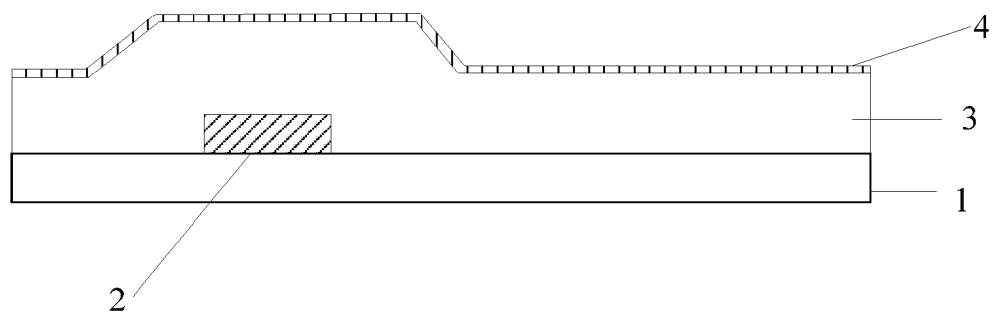

Step S2, a lipophilic material layer 4 is deposited on the gate insulating layer 3. FIG. 2 shows the structure formed by step 2. Comparing to the structure of FIG. 1, the structure further includes the lipophilic material layer 4.

The material used to form the lipophilic material layer may be selected according to requirement. This material should have a good lipophilic property and can be attached to the gate insulating layer. The correspondingly fabricated thin film transistor structures shall also fall within the protection scope of the disclosure.

Alternatively, in the embodiment of the disclosure, hexamethyldisilazane (HMDS) may be used to form the lipophilic material layer. If the lipophilic material is selected, in the above step S2, a monomolecular layer of the HMDS is deposited as the lipophilic material layer. The HMDS is selected to form the lipophilic material layer, then the molecules in the upper surface of the corresponding lipophilic material layer are in an order way, and it can facilitate improving of the migration rate of the organic semiconductor layer.

Figure 3:
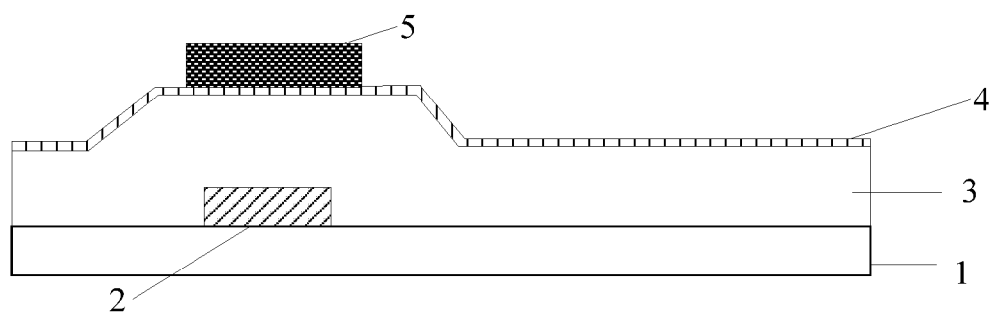

Step S3, a photoresist material layer is coated on the lipophilic material layer, the photoresist material layer is exposed and developed to remove the photoresist material located at regions other than the region for forming the organic semiconductor layer thereon and obtain a photoresist remained region and a photoresist removed region. FIG. 3 shows the structure formed by step S3. Comparing to the structure of FIG. 2, the structure further includes a photoresist layer 5 located in the photoresist remained region.

Figure 4:
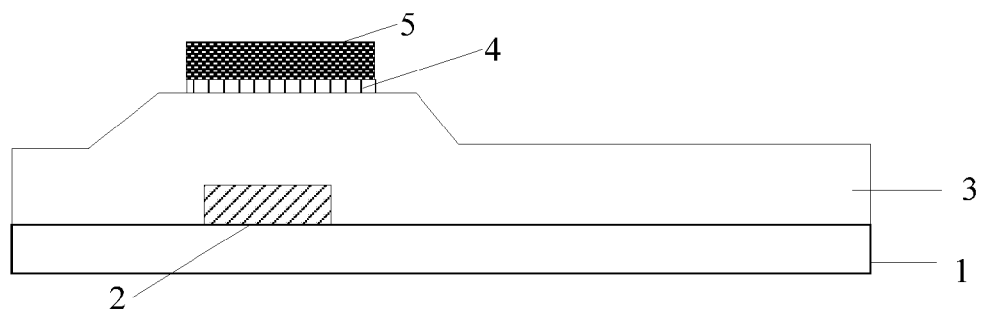

Step S4, a dry etching is performed on the structure processed by step 3 to remove a part of photoresist on the photoresist remained region and remove the lipophilic material on the photoresist removed region. As such, the lipophilic material is only remained on the photoresist remained region. Such structure is referred to a lipophilic layer hereunder. FIG. 4 shows the structure formed by step S4. Comparing to the structure of FIG. 3, in the structure of FIG. 4, the lipophilic material is removed from the photoresist removed region which does not include the photoresist.

Step S5, a hydrophilic treatment is performed on an upper surface of the gate insulating layer on the region in which the lipophilic material is removed in the structure processed by S4 so that the hydrophilicity of the upper surface of the gate insulating layer on the region is improved.

For example, in step S5, a surface treatment agent (e.g. benzoic acid or diazonium salt) may be used to clean the upper surface of the gate insulating layer on the region in which the lipophilic material is removed; or ions may be used to bombard the upper surface of the gate insulating layer on the region in which the lipophilic material is removed. In this case, the lipophilic layer is coated with the photoresist, it would not be treated by the surface treatment agent and not be bombarded by ions.

The process of step S5 can improve the hydrophilic property of the gate insulating layer, and correspondingly reduce its lipophilic property. As such, it may further increase lipophilic contrast ratio between the gate insulating layer and the lipophilic layer, and it is beneficial to improve the profile or shape of edges (corresponding to edges of lipophilic layer) of the organic semiconductor layer. In applications, if the lipophilic contrast ratio between the gate insulating layer and the lipophilic layer is large enough (e.g. suitable organic semiconductor material is selected to avoid the problem), the step S5 may be omitted.

Figure 5:
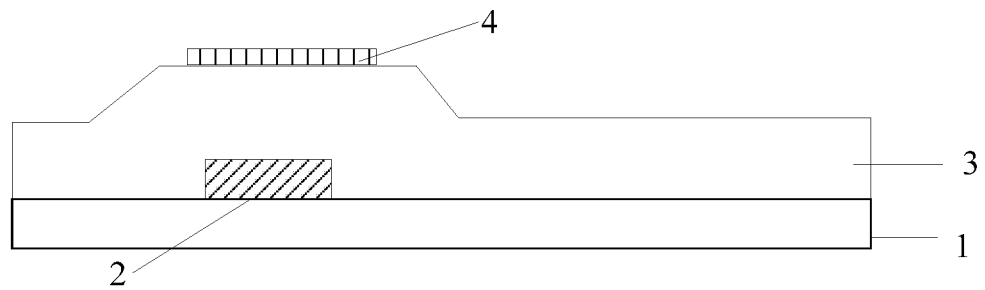

Step S6, the remained photoresist is removed from the lipophilic layer. FIG. 5 shows the structure processed by step S6. Comparing to the structure of FIG. 4, the structure of FIG. 5 does not include the photoresist layer 5.

Figure 6:
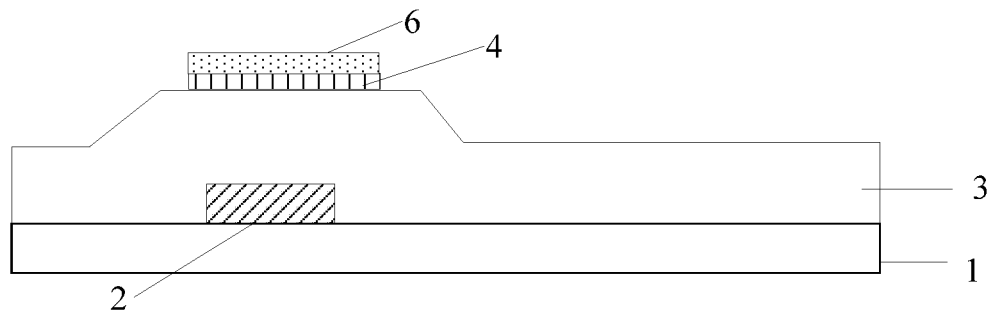

Step S7, an organic semiconductor layer is formed on the lipophilic layer in the structure processed by step S6 by using a wet process. For example, a solution of lipophilic organic semiconductor material may be deposited on the structure processed by step S6. Due to the lipophilic property of the organic semiconductor material, the organic semiconductor material cannot be attached to an exposed upper surface of a hydrophilic structural layer, instead, it can be attached to an upper surface of the lipophilic layer. FIG. 6 shows the structure processed by step S7. Comparing to the structure of FIG. 5, the structure of FIG. 6 further includes the organic semiconductor layer 6.

For example, the organic semiconductor layer may be 6,13-bis(triisopropylsilylethynyl)pentacene, but the present disclosure is not limited thereto. For example, it may be made of other organic semiconductor materials suitable for the wet process.

Figure 7:
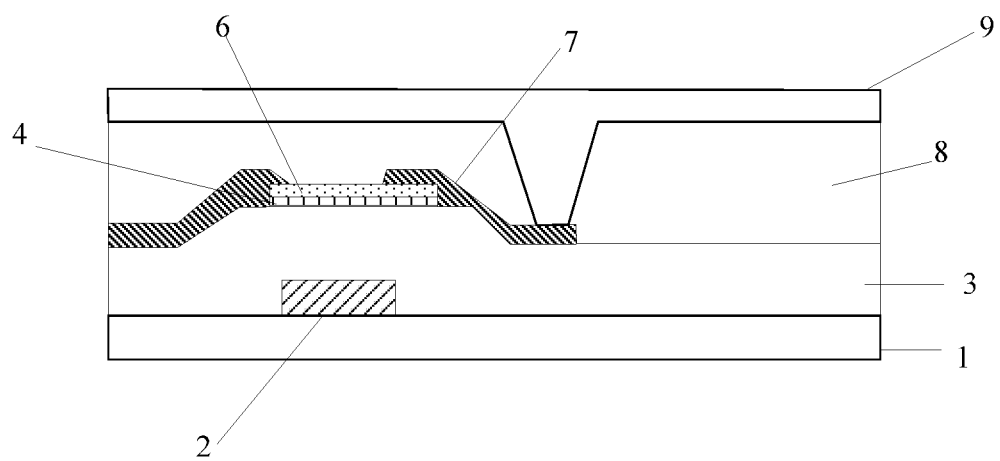

Furthermore, for example, the above method may further includes steps of forming a source-drain electrode layer, a passivation layer and a pixel electrode layer, and the processes may refer to conventional technology, which are not repeated herein. FIG. 7 shows the final structure, and the structure includes the substrate 1, the gate electrode 2 formed on the substrate 1, the gate insulating layer 3 formed on the gate electrode 2, the lipophilic layer 4 formed on the insulating layer 3, the organic semiconductor layer 6 formed on the lipophilic layer 4, the source electrode and the drain electrode 7 formed on the organic semiconductor layer 6 and the insulating layer 3, the passivation layer 8 formed on the source electrode and the drain electrode 7, and the pixel electrode 9 formed on the passivation layer 8. The passivation layer 8 has a via hole, and the pixel electrode 9 is connected with the source electrode and the drain electrode 7 through the via hole. Different from prior art, the thin film transistor manufactured by the method according to the embodiments of the present disclosure includes a lipophilic layer 4, and the position of the lipophilic layer 4 corresponds to that of the organic semiconductor layer 6, and the lipophilic layer 4 has a same area with the organic semiconductor layer 6.

The embodiments of the present disclosure further provide a thin film transistor, and the thin film transistor can be made by the above manufacturing method. The thin film transistor includes a hydrophilic structural layer, a lipophilic layer formed on the hydrophilic structural layer, and an organic semiconductor layer formed on the lipophilic layer in layering way. The organic semiconductor layer has a same area with the lipophilic layer and its position corresponds to that of the lipophilic layer. In a case that the thin film transistor is a bottom gate type of the thin film transistor, FIG. 7 shows a possible structure.

For example, as shown in FIG. 7, the thin film transistor includes a gate electrode 2, a gate insulating layer 3 formed on the gate electrode 2, a lipophilic layer 4 formed on the gate insulating layer 3, an organic semiconductor layer (i.e. an active layer) 6 formed on the lipophilic layer 4, and a source-drain electrode layer 7 formed on the organic semiconductor layer 6.

The embodiments of the disclosure also provide an array substrate, and the array substrate includes a plurality of the thin film transistors manufactured by the method of the present disclosure.

The embodiments of the disclosure also provide a display panel including the array substrate.

The embodiments of the disclosure also provide a display device including the display panel. For example, the display device may be a mobile phone, a computer, a television, a tablet computer, or any device having display function.

In the method for manufacturing the thin film transistor provided by the embodiments of the present disclosure, firstly, the lipophilic material layer is formed on the hydrophilic structural layer, and then the lipophilic material layer is patterned to get the lipophilic layer. As such, the organic material is only attached to the lipophilic layer when the lipophilic organic material is deposited by the wet process. Therefore, it can be readily to realize wet fabrication of the thin film transistor.

The described above are only illustrative embodiments for explaining the present disclosure. For one of ordinary skill in the art, various modifications and improvements may be made without departing from the spirit and scope of embodiments of the present disclosure, and all of which should fall within the protection scope of the present disclosure.

The present application claims priority of Chinese patent application No. 201510363671.9 filed on Jun. 26, 2015 and entitled "THIN FILM TRANSISTOR AND MANUFACTURING METHOD THEREOF, ARRAY SUBSTRATE, DISPLAY PANEL AND DISPLAY DEVICE", the entire contents of which are incorporated herein by reference.

What is claimed is:

1. A method of manufacturing a thin film transistor, comprising: forming an organic semiconductor layer on a hydrophilic structural layer; wherein the forming of the organic semiconductor layer on the hydrophilic structural layer comprises:
    forming a lipophilic material layer on an upper surface of the hydrophilic structural layer;
    patterning the lipophilic material layer to remove the lipophilic material of the lipophilic material layer located at regions other than a region for forming the organic semiconductor layer thereon and remain the lipophilic material located at the region for forming the organic semiconductor layer thereon to form a lipophilic layer;
    forming the organic semiconductor layer on the lipophilic layer through a wet process by using a lipophilic organic material;
    applying photoresist on the lipophilic material layer;
    exposing and developing the photoresist to form a photoresist remained region and a photoresist removed region;
    removing a part of the photoresist on the photoresist remained region and the lipophilic material on the photoresist removed region; and
    performing a hydrophilic treatment on an upper surface of the hydrophilic structural layer on the region in which the lipophilic material is removed.

2. The manufacturing method according to claim 1, further comprising:
    cleaning the upper surface of the hydrophilic structural layer on the region in which the lipophilic material is removed by using a surface treatment agent; or
    bombarding the upper surface of the hydrophilic structural layer on the region in which the lipophilic material is removed by using ions.

3. The manufacturing method according to claim 2, wherein the surface treatment agent comprises benzoic acid or diazonium salt.

4. The manufacturing method according to claim 3, wherein the lipophilic organic material comprises 6,13-bis(triisopropylsilylethynyl)pentacene.

5. The manufacturing method according to claim 2, wherein the lipophilic organic material comprises 6,13-bis(triisopropylsilylethynyl)pentacene.

6. The manufacturing method according to claim 1, wherein the hydrophilic structural layer includes a gate insulating layer.

7. The manufacturing method according to claim 6, wherein the lipophilic material layer comprises hexamethyldisilazane (HMDS).

8. The manufacturing method according to claim 6, wherein the lipophilic organic material comprises 6,13-bis(triisopropylsilylethynyl)pentacene.

9. The manufacturing method according to claim 1, wherein the lipophilic material layer comprises hexamethyldisilazane (HMDS).

10. The manufacturing method according to claim 9, wherein the lipophilic organic material comprises 6,13-bis(triisopropylsilylethynyl)pentacene.

11. The manufacturing method according to claim 1, further comprising:
    removing the remained photoresist from the photoresist remained region to form the lipophilic layer.

12. The manufacturing method according to claim 11, wherein the lipophilic organic material comprises 6,13-bis(triisopropylsilylethynyl)pentacene.

13. The manufacturing method according to claim 1, wherein the lipophilic organic material comprises 6,13-bis(triisopropylsilylethynyl)pentacene.

\* \* \* \* \*